United States Patent [19]
Shaffer et al.

[11] Patent Number: 5,619,513
[45] Date of Patent: Apr. 8, 1997

[54] FAST, COST-EFFECTIVE METHOD FOR MEMORY TESTING

[75] Inventors: Shmuel Shaffer; David Weiss, both of Palo Alto, Calif.

[73] Assignee: Siemens Business Communications Systems, Inc., Santa Clara, Calif.

[21] Appl. No.: 603,562

[22] Filed: Feb. 21, 1996

Related U.S. Application Data

[63] Continuation of Ser. No. 262,426, Jun. 20, 1994, abandoned.

[51] Int. Cl.$^6$ ............................................. G06F 11/00
[52] U.S. Cl. ............................................ 371/25.1; 371/26
[58] Field of Search ................................. 371/26.2, 25.1, 371/26

[56] References Cited

U.S. PATENT DOCUMENTS 5,357,473  10/1994  Mizuno et al. ...................... 371/21.1

OTHER PUBLICATIONS

*Computer Architecture and Organization,* Second Edition, John P. Hayes © 1988 by Mc–Graw Hill, Inc. pp. 513–517.
*Structure Computer Organization,* Third Edition by Andrew S. Tanenbaum © 1990 by Prentice–Hall Inc. pp. 11–13.

*Primary Examiner*—Vincent P. Canney

[57] ABSTRACT

Rapid and efficient memory testing is provided by using direct memory access techniques. This hardware-based scheme operates at a considerably faster rate than a software-dependent solution running on a system's central processor.

20 Claims, 2 Drawing Sheets

FAST, COST-EFFECTIVE METHOD FOR MEMORY TESTING

CROSS-REFERENCE TO RELATED APPLICATION

This is a continuation of Ser. No. 08/262,426 filed Jun. 20, 1994 now abandoned.

FIELD OF THE INVENTION

This invention relates generally to testing. Specifically, the invention relates to an apparatus and a method for rapidly and efficiently testing memories such as the RAM in a computer.

BACKGROUND OF THE INVENTION

RAM is a common component of many systems. To insure that it is functioning properly, systems will generally test the memory upon start-up. One method tests a memory by generating data patterns, writing them into the memory, reading the memory back, and then comparing the retrieved data against the original pattern. Errors may occur in either the data or the memory address. The program for running the test would reside typically in a separate memory such as an EPROM or a ROM and is executed on a processor.

If the computer's processor is used to generate, write, retrieve, and compare the test dam, the process will require a significant amount of time for completion, taking into account the four operations just noted. The time required to complete the test is proportional to the size of the memory under test, the speed of the processor, the speed of the memory, and the number and type of patterns used. This may present a severe disadvantage where the time available for conducting such a test is limited. Therefore, it would be desirable to provide a system that can rapidly and efficiently test a memory.

SUMMARY OF THE INVENTION

These and other objects are achieved by a memory testing arrangement utilizing direct memory access. The testing is performed by dedicated hardware, an arrangement significantly faster than software-based solutions.

A hardware pattern generator resident in a peripheral controller generates the desired pattern and a DMA (direct memory access) controller transfers the data to and from the memory, bypassing the processor. A hardware data checker, also resident in a peripheral controller, is used to compare data read from the memory against the original pattern. The test apparatus can be an integral part of the system under test.

Testing is accomplished in two phases. First, a program (software or firmware) directs the hardware pattern generator resident in the peripheral controller to generate the data, which is then written to memory by the DMA controller. Next, the DMA controller retrieves the stored data, passing it to the data checker in the peripheral controller, which verifies that the data is correct.

This scheme will be faster than a software-implemented procedure, as data generation, transfer, and comparison are performed in parallel, by dedicated hardware, and a DMA-controlled transfer is typically faster than a processor-controlled transfer, especially when performed in burst-mode. Indeed, this approach can offer performance that runs 50-to-100 times faster than a software-based design. Also, the testing can be run concurrently while other (e.g., diagnostic) functions are performed by the processor. Further, the hardware cost for this arrangement is minimal, especially where a system already contains an FPGA (field programmable gate array) or an ASIC (application specific integrated circuit).

BRIEF DESCRIPTION OF THE DRAWINGS

A more complete understanding of the present invention, as well as other objects and advantages thereof not enumerated herein, will become apparent upon consideration of the following detailed description and the accompanying drawings, wherein.

DETAILED DESCRIPTION OF THE INVENTION

Figure 1:
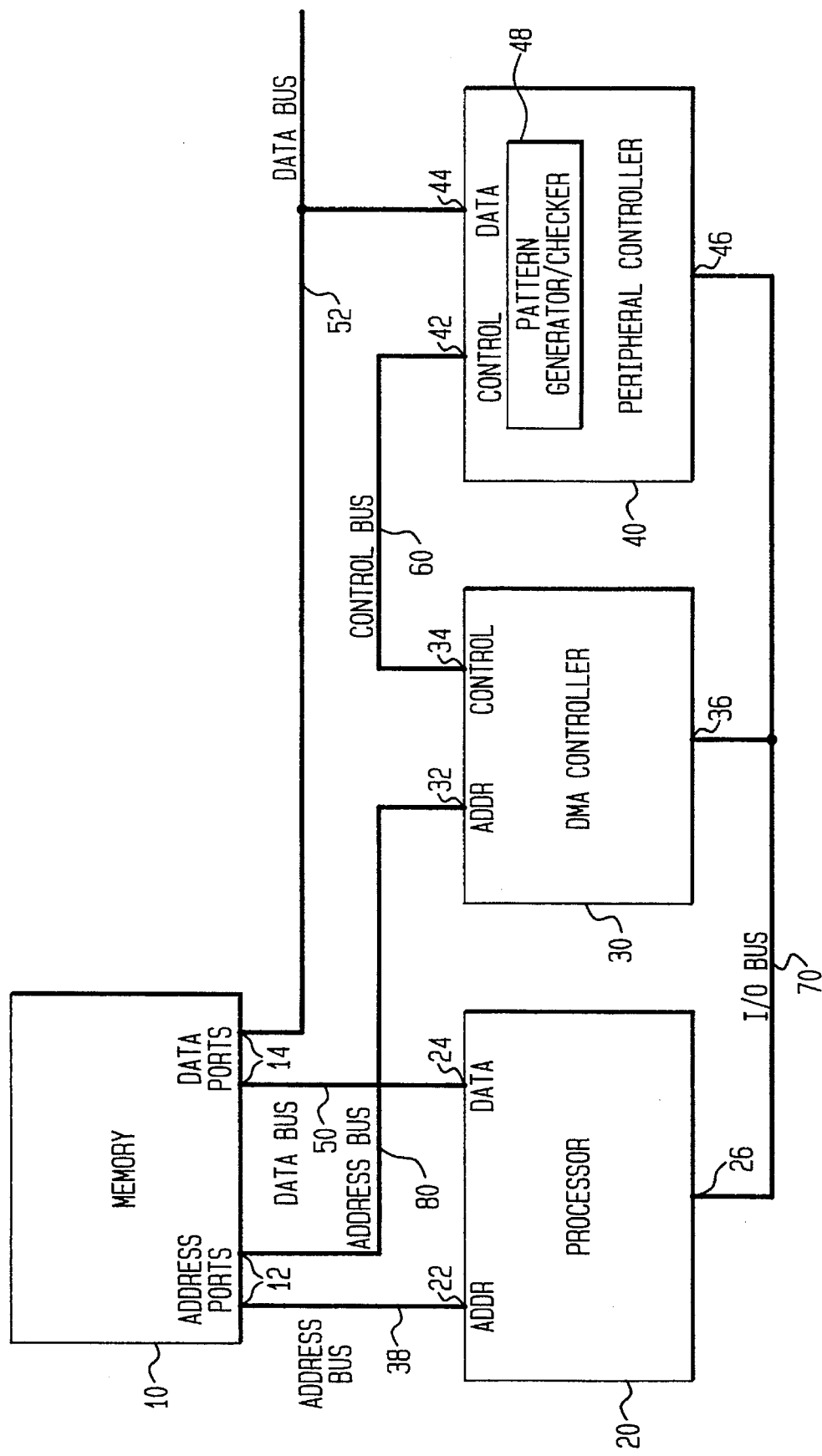
FIG. 1 is a block diagram of a memory testing arrangement.

A memory testing arrangement is illustrated in FIG. 1. It has a random access memory (RAM) 10, a processor 20, a DMA controller 30, and a peripheral controller 40. The peripheral controller 40 contains a pattern generator/checker 48.

The RAM 10 receives address information at address ports 12 from an address bus 38 connected to an address port 22 on the processor 20 and from a separate address bus 80 connected to an address port 32 on the DMA controller 20. Data is passed between a data port 14 on the RAM 10 connected to a data port 24 on the processor 20 by way of a data bus 50. Data also passes between a data port 14 and the peripheral controller 40 through a data port 44 by way of a separate data bus 52. It should be understood that, with the addition of appropriate circuitry to resolve and control bus access, both the address buses 38 and 80 and the data buses 50 and 52 could be configured as unified address and data buses, respectively.

A DMA control bus 60 interconnects the DMA controller 30 and the peripheral controller 40 through a control ports 34 and 42, respectively. I/O control among the processor 20, DMA controller 30, and peripheral controller 40 is achieved by an input/output control bus 70 connecting these three elements at I/O ports 26, 36, and 46, respectively. Test data is created and checked by a pattern generator/checker 48 resident in the peripheral controller 40.

Utilizing the I/O control bus 70, the processor 20 initializes the DMA controller 30 and the peripheral controller 40. The peripheral controller 40 then prompts the DMA controller 30 over the DMA control bus 60. Memory access is acquired by memory request lines (not shown) running from the processor 20 and DMA controller 30, respectively, to the RAM 10.

The DMA controller 30 then begins the testing routine by writing a selected data pattern from the pattern generator/checker 48 into the RAM 10 until the peripheral controller 40 ceases to request memory references or a counter within the DMA controller 30, corresponding to the number of accessible locations in the RAM 10, reaches its maximum count. When the maximum count is reached, the DMA controller 30 terminates the transfer of data from the peripheral controller 40 the RAM 10 and sends an interrupt signal to the processor 20, indicating that the "write" phase of the test has been completed.

During the next phase of the test, the RAM 10 is again addressed by the DMA controller 30 and the data in the RAM 10 is read out and transferred to the pattern generator/checker 48. The pattern generator/checker 48 checks the data as it is being read against the original pattern and verifies that it is correct. If an error is detected, it can be recorded and, at the option of the user, the testing can continue or terminate. Upon termination of the testing, whether because of an error or upon a successful completion of a test, the DMA controller sends an interrupt signal to the processor 20.

The method and apparatus described here avoids the need for a software routine running on the processor 20 to generate the pattern. The rate of testing is limited only by the speed at which the chip embodying the pattern generator/checker 48 and the DMA controller 30 can run, and the RAM 10 access time. Thus, the total time needed to complete a test is the sum of read and write times.

Figure 2:
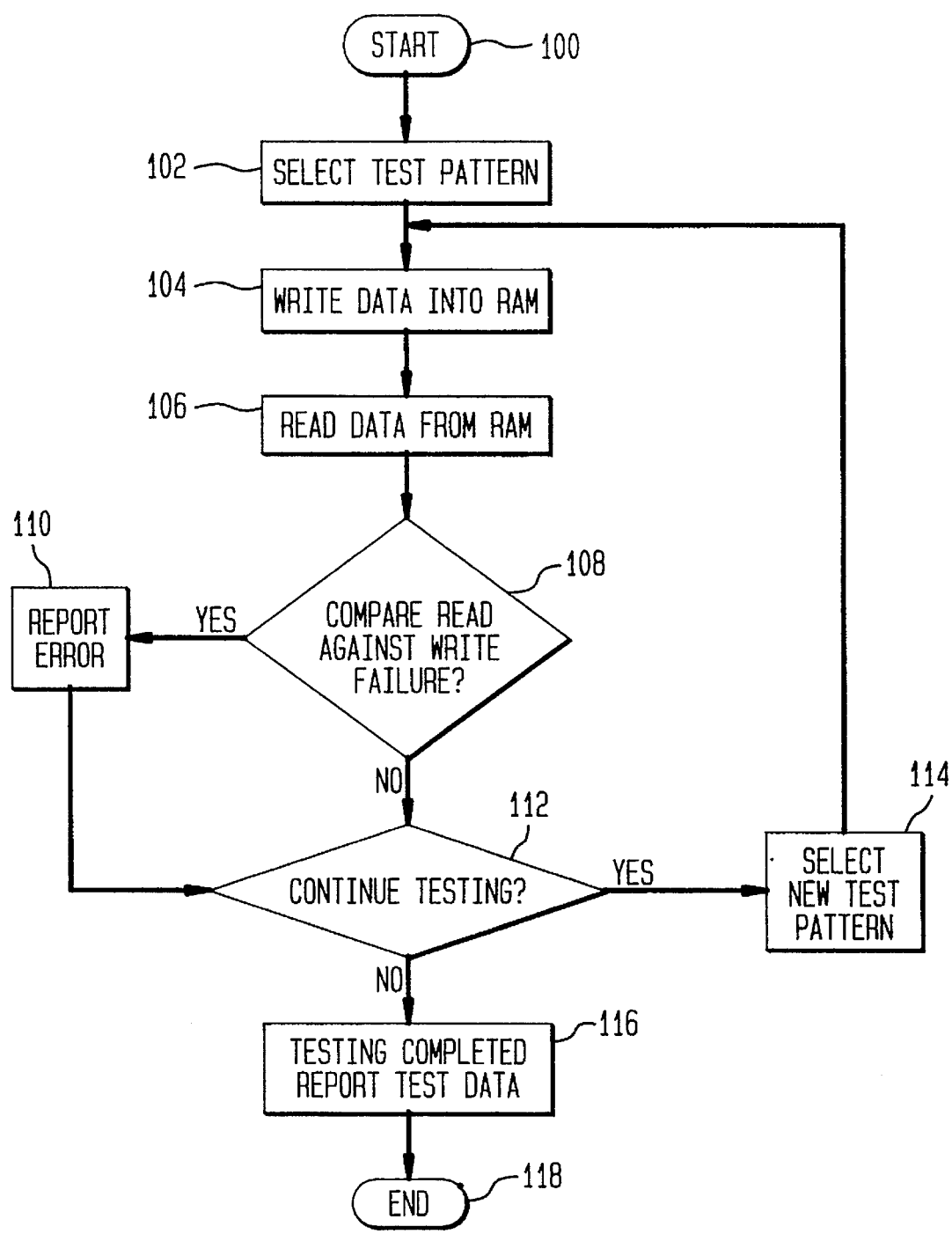
FIG. 2 is a flow chart of the operation of the memory testing arrangement.

A routine for memory testing that can be implemented either by software or hardware is shown in the flow chart of FIG. 2. (The numbers in parentheses refer to the steps in the flow chart.) At the start (100), a test pattern is selected (102). The selected pattern is first written into the in RAM 10 and then subsequently read back and compared (104, 106, 108). Upon conclusion of the comparison, if an error is detected (108), the failure can be reported, logged, and/or displayed (110) if desired. Irrespective of whether there was an error, testing can be continued with a new or a different pattern (112, 114) as dictated by the user or the testing routine, or testing can be discontinued and a report generated (116), ending the testing session (118).

It should be understood that a variety of devices and hardware configurations may be utilized to achieve a direct or hardware (e.g., non-software) memory access. For example, the DMA controller 30 could be replaced by some other circuit or device that would perform the same function. Also, it should be understood that the component and bus arrangement shown in FIG. 1 is simply for purposes of explanation. Additionally, one can vary the sequence and order of writing to and reading from the RAM 10, including the order of accessing individual locations in the RAM 10.

While there has been described what is believed to be the preferred embodiment of the invention, those skilled in the art will recognize that other and further modifications may be made thereto without departing from the spirit of the invention, and it is intended to claim all such embodiments that fail within the true scope of the invention. Other configurations and architectures affording direct access to the memory could be employed as well.

What is claimed is:

1. A method for testing a memory system comprising the steps of:
   (a) initializing, by a processor, a DMA controller and a peripheral controller;
   (b) in response to the initializing in step (a), writing a test pattern generated by a pattern generator within the peripheral controller to a random access memory, writing of the test pattern being controlled by the DMA controller; and,
   (c) retrieving, from the random access memory to the peripheral controller, the test pattern written into the random access memory in step (b), including the following substep,
      (c.1) comparing, using a data checker within the peripheral controller, the test pattern as retrieved from the random access memory with the test pattern as generated in step (b) to detect whether any errors have occurred.

2. A method as in claim 1 wherein in step (a) the processor utilizes an I/O control bus to initialize the DMA controller and the peripheral controller.

3. A method as in claim 2, wherein step (b) includes the peripheral controller prompting the DMA controller to begin writing the test pattern to the random access memory, the prompting being done after the peripheral controller is initialized by the processor and the prompting occurring over a DMA control bus connected between the DMA controller and the peripheral controller.

4. A method as in claim 1 wherein in step (b) the test pattern is written into all memory locations within the random access memory.

5. A method as in claim 4 wherein step (b) includes the following substep:
   (b.1) upon completion of writing the test pattern into all the memory locations within the random access memory, sending an interrupt from the peripheral controller to the processor to notify the processor the test pattern has been written to the random access memory.

6. A method as in claim 1 wherein in substep (c.1), upon the data checker detecting an error, the peripheral controller interrupts the processor and notifies the processor of the detected error.

7. A method as in claim 1 wherein in substep (c.1), upon the data checker completing the comparison without detecting any error, the peripheral controller interrupts the processor and notifies the processor of the completion of the comparison without detection of any errors.

8. A method as in claim 1 wherein the pattern generator in step (b) also functions as the data checker in substep (c.1).

9. A method as in claim 1 additionally comprising the following steps:
   (d) after completion of step (c), writing a new test pattern generated by the pattern generator within the peripheral controller to the random access memory, writing of the new test pattern being controlled by the DMA controller; and,
   (e) retrieving, from the random access memory to the peripheral controller, the new test pattern written into the random access memory in step (d), including the following substep,
      (e.1) comparing, using the data checker within the peripheral controller, the new test pattern as retrieved from the random access memory with the new test pattern as originally generated in step (d).

10. A computing system comprising:
    a main memory having a first address port and a first data port;
    a main processor connected to the main memory;
    a first controller, distinct from the main processor and coupled to the first address port of the main memory, the first controller placing addresses on the first address port in order to indicate memory locations of the memory to be accessed through the first data port; and
    a pattern generator and checker, distinct from the main processor and coupled to the first data port of the memory, wherein during a first phase of testing the memory, the pattern generator and checker generates a test pattern which is written into the main memory under control of the first controller, and wherein during a second phase of testing the memory, the pattern generator and checker, under control of the first controller, reads data which was stored in the main memory during the first phase, and compares the read with the test pattern.

11. A computing system as in claim 10 wherein the pattern generator and checker is within a peripheral controller.

12. A computing system as in claim 11 wherein the main processor is coupled to the first controller and the peripheral controller through an I/O control bus, the main processor, before the first phase using the control bus to initialize the first controller and the peripheral controller.

13. A computing system as in claim 12, wherein the peripheral controller is coupled to the first controller through a control bus, the peripheral controller prompting the first controller over the control bus to begin the first phase of testing the memory, the prompting being done after the peripheral controller is initialized by the main processor.

14. A computing system as in claim 10 wherein the main processor is coupled to a second data port of the memory and to a second address port of the memory.

15. A method for testing a memory system comprising the steps of:

(a) initializing, by a processor, a first controller containing a pattern generator and checker, the first controller being distinct from the processor and the pattern generator and checker being implemented in hardware;

(b) in response to the initializing in step (a), writing a test pattern generated by the pattern generator and checker to a random access memory; and, (c) retrieving, from the random access memory to the first controller, the test pattern written into the random access memory in step (b), including the following substep, (c.1) comparing, using the pattern generator and checker within the first controller, the test pattern as retrieved from the random access memory with the test pattern as generated in step (b) to determine whether any errors occurred.

16. A method as in claim 15 wherein in step (a) the processor utilizes an I/O control bus to initialize the first controller.

17. A method as in claim 15 wherein in step (b) the test pattern is written into all memory locations within the random access memory.

18. A method as in claim 15 wherein step (b) includes the following substep:

(b.1) upon completion of writing the test pattern into all memory locations within the random access memory, sending an interrupt from the first controller to the processor to notify the processor the test pattern has been written to the random access memory.

19. A method as in claim 15 wherein in substep (c.1), upon the pattern generator and tester detecting an error, the first controller interrupts the processor and notifies the processor of the detected error.

20. A method as in claim 15 wherein in substep (c.1), upon the pattern generator and tester completing the comparison without detecting any error, the first controller interrupts the processor and notifies the processor of the completion of the comparison without detection of any errors.

* * * * *